(12) United States Patent
Wan

(10) Patent No.: US 9,954,192 B2
(45) Date of Patent: Apr. 24, 2018

(54) BLUE ORGANIC ELECTROLUMINESCENT DEVICE AND PREPARATION METHOD THEREOF, DISPLAY PANEL AND DISPLAY APPARATUS

(71) Applicant: Boe Technology Group Co., Ltd., Beijing (CN)

(72) Inventor: Xiang Wan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 15/023,295

(22) PCT Filed: Jul. 15, 2015

(86) PCT No.: PCT/CN2015/084087
§ 371 (c)(1),
(2) Date: Mar. 18, 2016

(87) PCT Pub. No.: WO2016/155147
PCT Pub. Date: Oct. 6, 2016

(65) Prior Publication Data
US 2017/0047536 A1    Feb. 16, 2017

(30) Foreign Application Priority Data

Mar. 30, 2015   (CN) .......................... 2015 1 0144863

(51) Int. Cl.
*H01L 51/50* (2006.01)
*H01L 51/56* (2006.01)
*H01L 27/32* (2006.01)

(52) U.S. Cl.
CPC .......... *H01L 51/5012* (2013.01); *H01L 27/32* (2013.01); *H01L 51/5056* (2013.01);
(Continued)

(58) Field of Classification Search
CPC .................................................. H01L 51/5036
See application file for complete search history.

(56) References Cited

U.S. PATENT DOCUMENTS

| 2005/0046337 A1 | 3/2005 | Chin et al. |
| 2012/0153324 A1* | 6/2012 | Lin ..................... H01L 51/5036 257/98 |
| 2016/0005990 A1* | 1/2016 | Lee ..................... H01L 51/5278 257/40 |

FOREIGN PATENT DOCUMENTS

| CN | 1668155 | 9/2005 |
| CN | 101710611 | 5/2010 |

(Continued)

OTHER PUBLICATIONS

Office action from Chinese Application No. 201510144863.0 dated Jul. 6, 2016.

(Continued)

*Primary Examiner* — Fernando L Toledo
*Assistant Examiner* — Valerie N Newton
(74) *Attorney, Agent, or Firm* — Calfee, Halter & Griswold LLP

(57) ABSTRACT

Embodiments of the invention provide a blue organic electroluminescent device and a preparation method, a display panel and a display apparatus. The blue organic electroluminescent device comprises: a substrate and an anode, a hole injection layer, a hole transport layer, a light emitting layer, an electron transport layer, an electron injection layer and a cathode arranged on the substrate successively, the light emitting layer comprises a lower surface layer, an upper surface layer and an intermediate layer; host emitters of the lower surface layer, the upper surface layer and the intermediate layer are all doped with guest emitters, at least one of the doping concentrations in the lower surface layer and the upper surface layer is greater than a doping concentra- (Continued)

tion in the intermediate layer. The power consumption of the blue organic electroluminescent device is greatly reduced; and the efficiency is increased significantly.

20 Claims, 2 Drawing Sheets

(52) U.S. Cl.
CPC ...... *H01L 51/5072* (2013.01); *H01L 51/5092* (2013.01); *H01L 51/56* (2013.01)

(56) References Cited

FOREIGN PATENT DOCUMENTS

| | | |
|---|---|---|
| CN | 102024909 | 4/2011 |
| CN | 102456842 | 5/2012 |
| CN | 103762317 | 4/2014 |
| CN | 104638115 | 5/2015 |
| CN | 104716265 | 6/2015 |
| JP | 2012151322 | 8/2012 |
| WO | 2012/039241 | 3/2012 |

OTHER PUBLICATIONS

International Search Report and Written Opinion from PCT/CN15/84087 dated Jan. 13, 2016.

\* cited by examiner

BLUE ORGANIC ELECTROLUMINESCENT DEVICE AND PREPARATION METHOD THEREOF, DISPLAY PANEL AND DISPLAY APPARATUS

RELATED APPLICATIONS

The present application is the U.S. national phase entry of PCT/CN2015/084087, with an international filling date of Jul. 15, 2015, which claims the benefit of Chinese Patent Application NO. 201510144863.0, filed on Mar. 30, 2015, the entire disclosure of which are incorporated herein by reference.

FIELD OF THE INVENTION

The present invention relates to the field of display technology, particularly to a blue organic electroluminescent device and a preparation method thereof, a display panel and a display apparatus.

BACKGROUND OF THE INVENTION

The organic light emitting diode (OLED) display has the characteristics of being full solid state, autoluminescence, high contrast and wide viewing angle and so on, and is a next generation of panel display technology following the liquid crystal display (LCD).

An OLED display apparatus is generally provided with a red organic light emitting diode (i.e., red OLED), a green organic light emitting diode (i.e., green OLED) and a blue organic light emitting diode (i.e., blue OLED). Color display of the OLED display apparatus can be realized by organic light emitting diodes that emit red light, green light and blue light.

Low power consumption and high efficiency are always important indexes for the OLED display apparatus. At present, power consumption reduction and efficiency enhancement for the OLED display apparatus can be realized by reducing the power consumption of the blue OLED in the OLED display apparatus and improving the efficiency of the blue OLED. However, reducing the power consumption of the blue OLED and improving the efficiency of the blue OLED cannot be effected simultaneously, such that low power consumption and high efficiency of the OLED display apparatus also cannot be realized simultaneously.

SUMMARY OF THE INVENTION

With respect to the above technical problems in the prior art, embodiments of the invention provide a blue organic electroluminescent device and a preparation method, a display panel and a display apparatus. By enabling the doping concentration of guest emitters in at least one of the lower surface layer and the upper surface layer to be greater than the doping concentration of guest emitters in the intermediate layer, the blue organic electroluminescent device can reduce greatly the voltage that excites the blue organic electroluminescent device to emit light, thereby enabling the power consumption of the blue organic electroluminescent device to be reduced greatly. Meanwhile, it can also drive the exciton recombination zone to move towards the center of the light emitting layer, thereby no interface state exists between the exciton recombination zone formed by combination of holes and electrons and the hole transport layer, so as to reduce occurrence of exciton quenching phenomenon, and increase the efficiency of the blue organic electroluminescent device greatly.

According to a first aspect of the present invention, an embodiment of the invention provides a blue organic electroluminescent device, comprising: a substrate and an anode, a hole injection layer, a hole transport layer, a light emitting layer, an electron transport layer, an electron injection layer and a cathode arranged on the substrate successively, the light emitting layer comprises a lower surface layer close to a side of the hole transport layer, an upper surface layer close to a side of the electron transport layer and an intermediate layer sandwiched between the upper surface layer and the lower surface layer; host emitters of the lower surface layer, the upper surface layer and the intermediate layer are all doped with guest emitters, a doping concentration in the lower surface layer is greater than a doping concentration in the intermediate layer, and a doping concentration in the upper surface layer is greater than the doping concentration in the intermediate layer; or the doping concentration in the lower surface layer is greater than a doping concentration in the intermediate layer, the doping concentration in the upper surface layer is equal to the doping concentration in the intermediate layer; or, the doping concentration in the upper surface layer is greater than the doping concentration in the intermediate layer, the doping concentration in the lower surface layer is equal to the doping concentration in the intermediate layer.

In an embodiment, the doping concentration in the intermediate layer is in a range of 4%-8%, the doping concentrations in the lower surface layer and the upper surface layer may be both in a range of 20%-50%.

In an embodiment, the doping concentrations in the intermediate layer and the upper surface layer are both in a range of 4%-8%, the doping concentration in the lower surface layer is in a range of 20%-50%.

In an embodiment, the doping concentrations in the intermediate layer and the lower surface layer are both in a range of 4%-8%, the doping concentration in the upper surface layer is in a range of 20%-50%.

In an embodiment, the thickness of the lower surface layer may be in a range of 1-2 nm.

In an embodiment, the thickness of the upper surface layer may be in a range of 2-3 nm.

In an embodiment, the thickness of the intermediate layer may be in a range of 20-30 nm.

In an embodiment, the host emitter may comprise an n-type organic semiconductor material, and the guest emitter may comprise a p-type organic semiconductor material.

According to a second aspect of the invention, another embodiment further provides a display panel comprising any one of the above blue organic electroluminescent devices.

According to a third aspect of the invention, a further embodiment provides a display apparatus comprising the above mentioned display panel.

According to a fourth aspect of the invention, yet another embodiment further provides a preparation method for a blue organic electroluminescent device, comprising: forming an anode, a hole injection layer, a hole transport layer, a light emitting layer, an electron transport layer, an electron injection layer and a cathode on a substrate successively, the light emitting layer comprising a lower surface layer close to a side of the hole transport layer, an upper surface layer close to a side of the electron transport layer and an intermediate layer sandwiched between the upper surface layer and the lower surface layer, wherein forming the light emitting layer may comprise the steps of:

doping guest emitters in host emitters of the lower surface layer, the upper surface layer and the intermediate layer respectively, wherein a doping concentration in the lower surface layer is greater than a doping concentration in the intermediate layer, and a doping concentration in the upper surface layer is greater than the doping concentration in the intermediate layer; or the doping concentration in the lower surface layer is greater than a doping concentration in the intermediate layer, the doping concentration in the upper surface layer is equal to the doping concentration in the intermediate layer; or, the doping concentration in the upper surface layer is greater than the doping concentration in the intermediate layer, the doping concentration in the lower surface layer is equal to the doping concentration in the intermediate layer.

By enabling the doping concentration of guest emitters in at least one of the lower surface layer and the upper surface layer to be greater than the doping concentration of guest emitters in the intermediate layer, the blue organic electroluminescent device provided by embodiments of the invention can reduce greatly the voltage that excites the blue organic electroluminescent device to emit light, thereby enabling the power consumption of the blue organic electroluminescent device to be reduced greatly; meanwhile, it can also drive the exciton recombination zone to move towards the center of the light emitting layer, such that no interface state exists between the exciton recombination zone formed by combination of holes and electrons and the hole transport layer, so as to reduce occurrence of exciton quenching phenomenon, and increase the efficiency of the blue organic electroluminescent device greatly.

The display panel provided by the embodiment of the invention, by employing the above blue organic electroluminescent device, not only reduces the power consumption but also increases the efficiency. The display apparatus provided by the embodiment of the invention, by employing the above display panel, not only reduces the power consumption but also increases the efficiency.

DETAILED DESCRIPTION OF THE INVENTION

In order to enable the skilled person in the art to understand the technical solution of the present invention better, the blue organic electroluminescent device and corresponding preparation method, the display panel, and the display apparatus provided by embodiments of the invention will be described in more details with reference to the drawings. For the following description and accompanying figures, the following reference signs will be used:

1. substrate; 2. anode; 3. hole injection layer; 4. hole transport layer; 5. light emitting layer; 51. lower surface layer; 52. upper surface layer; 6. electron transport layer; 7. electron injection layer; 8. cathode.

Figure 1:
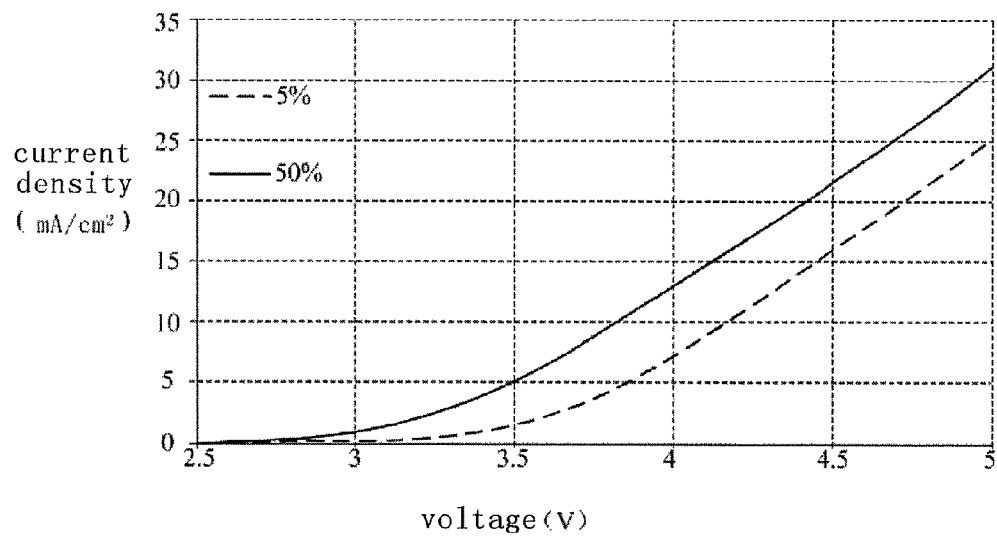
FIG. 1 is a voltage vs. current density variation curve diagram of a blue organic electroluminescent device when the doping concentration of the guest emitter material of the light emitting layer is 4%-8% and 50%.

For the light emitting layer of the blue OLED, a guest emitter material that has a high luminous efficiency is generally doped into a host emitter material in minute quantities and uniformly, so as to reduce power consumption of the blue OLED. As shown in FIG. 1, when the doping concentration of the guest emitter material in the host emitter material is 4%-8%, the voltage vs. current density variation curve of the blue OLED is as shown by the broken line in FIG. 1, although efficiency of the blue OLED is enhanced in this case, voltage for the blue OLED is increased, which is not a benefit for the blue OLED for display. If the uniform doping concentration of the guest emitter material in the host emitter material is too high, (e.g., when the doping concentration of the guest emitter material in the host emitter material is 50%), the voltage vs. current density variation curve of the blue OLED is as shown by the real line in FIG. 1. Compared to the case with a doping concentration of 4%-8%, the voltage for the blue OLED is reduced by 8.4%. However, since the doping concentration of 50% is also a doping concentration of doping the guest emitter material into the host emitter material uniformly, when the uniform doping concentration is above 50%, a concentration quenching effect easily occurs, which decreases efficiency of the blue OLED.

Moreover, since the host emitter material only transports one kind of current carrier generally, such as electrons, the exciton (which is formed by combination of holes and electrons) recombination zone is generally closer to the hole transport layer in the blue OLED. Thus, it may easily result in existence of interface state between the exciton recombination zone and the hole transport layer, thereby resulting in exciton quenching and enabling the voltage that excites the blue OLED to emit light to be increased. Exciton quenching will also decrease the efficiency of the blue OLED, and increase of the voltage that excites the blue OLED to emit light will directly result in increase of the power consumption of the blue OLED. None of these is beneficial for reducing the power consumption and improving the efficiency of the OLED display apparatus.

Figure 2:
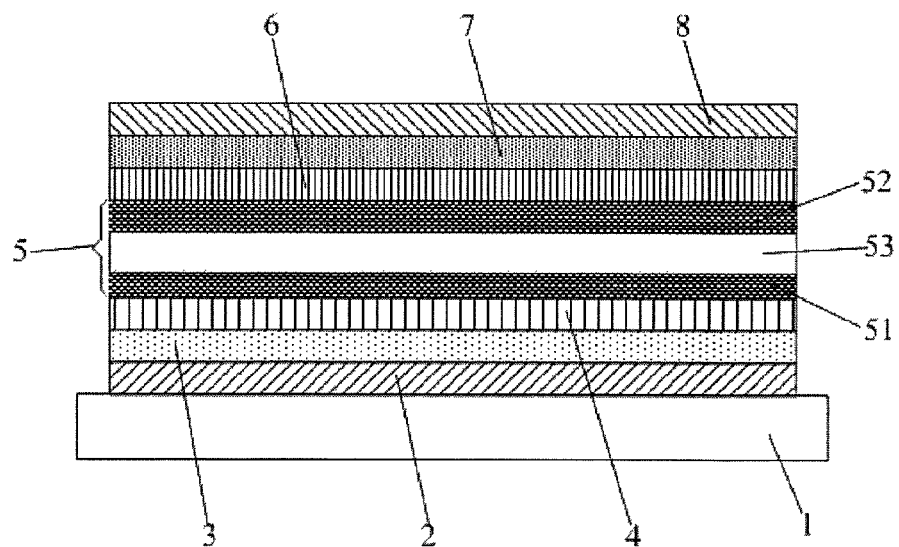
FIG. 2 is a structural sectional view of a blue organic electroluminescent device in an embodiment of the invention.

One embodiment of the invention provides a blue organic electroluminescent device, as shown in FIG. 2. The blue organic electroluminescent device may comprise a substrate 1 and an anode 2, a hole injection layer 3, a hole transport layer 4, a light emitting layer 5, an electron transport layer 6, an electron injection layer 7 and a cathode 8 arranged on the substrate 1 successively, the light emitting layer 5 may comprise a lower surface layer 51 close to a side of the hole transport layer 4, an upper surface layer 52 close to a side of the electron transport layer 6 and an intermediate layer 53 sandwiched between the upper surface layer 52 and the lower surface layer 51; each of the host emitters of the lower surface layer 51, the upper surface layer 52 and the intermediate layer 53 is doped with guest emitters; a doping concentration in the lower surface layer 51 is greater than a doping concentration in the intermediate layer 53, and a doping concentration in the upper surface layer 52 is greater than the doping concentration in the intermediate layer 53.

With the above setting for the light emitting layer 5, the voltage that is required for the blue organic electroluminescent device to emit light can be decreased greatly, thereby reducing the power consumption of the blue organic electroluminescent device greatly. Meanwhile, the above setting for the light emitting layer can also drive the exciton recombination zone to move towards the center of the light emitting layer 5, thereby no interface state exists between the exciton recombination zone formed by combination of holes and electrons and the hole transport layer, so as to reduce occurrence of exciton quenching phenomenon, and increase the efficiency of the blue organic electroluminescent device significantly.

In some embodiments, the doping concentration in the intermediate layer 53 may be in a range of 4%-8%, and the doping concentration in the lower surface layer 51 may be in a range of 20%-50%. The thickness of the lower surface layer 51 may be in a range of 1-2 nm. The doping concentration in the upper surface layer 52 may be in a range of 20%-50%. The thickness of the upper surface layer 52 may be in a range of 2-3 nm. Such a setting can increase migration rate of the holes in the light emitting layer 5, enhance injection balance of the electrons and the holes, and decrease the voltage that excites the blue organic electroluminescent device to emit light, thereby reducing the power consumption of the blue organic electroluminescent device; meanwhile, it can also drive the center of the exciton recombination zone to move towards the center of the light emitting layer 5, and reduce existence of interface state between the exciton recombination zone formed by combination of holes and electrons and the hole transport layer 4, thereby reducing occurrence of exciton quenching and increasing efficiency of the blue organic electroluminescent device.

In some embodiments, the thickness of the intermediate layer 53 may be in a range of 20-30 nm. The intermediate layer 53 of the above doping concentration and thickness can cooperate with the upper surface layer 52 and the lower surface layer 51 to increase the migration rate of the holes in the light emitting layer 5, to enhance the injection balance of the electrons and the holes, and to drive the center of the exciton recombination zone to move towards the center of the light emitting layer 5, which may reduce occurrence of exciton quenching This would not only reduce the power consumption of the blue organic electroluminescent device but also increasing the efficiency of the blue organic electroluminescent device.

In some embodiments, the host emitter of the light emitting layer 5 may use an n-type organic semiconductor material, and the guest emitter may use a p-type organic semiconductor material. Such host emitter material and guest emitter material are commonly used materials for the blue organic electroluminescent device. The light emitting layer 5 with this material can make the power consumption of the blue organic electroluminescent device lower and the efficiency higher.

For example, in some embodiments, the anode 2 may be made of a transparent conductive material such as tin indium oxide, the thickness of the anode 2 may be 70 nm. The thickness of the hole injection layer 3 may be 10 nm, the thickness of the hole transport layer 4 may be 120 nm, the thickness of the lower surface layer 51 of the light emitting layer 5 may be 2 nm, the doping concentration of the guest emitter in the lower surface layer 51 may be 50%, the thickness of the intermediate layer of the light emitting layer 5 may be 25 nm, the thickness of the upper surface layer 52 of the light emitting layer 5 may be 2 nm, the doping concentration of the guest emitter in the upper surface layer 52 may be 50%, the thickness of the electron transport layer 6 may be 25 nm, the thickness of the electron injection layer 7 may be 1 nm, the cathode 8 may be made of a metal conductive material such as Al, the thickness of the cathode 8 may be 150 nm. Compared to the guest emitter doping concentration of 4%-8%, the blue organic electroluminescent device provided by the embodiment of the invention can reduce the voltage for the blue organic electroluminescent device by 15%, and also enhance the efficiency of the blue organic electroluminescent device at the same time.

Based on the above structure of the blue organic electroluminescent device provided by the embodiment of the invention, another embodiment further provides a preparation method for a blue organic electroluminescent device, comprising: forming an anode, a hole injection layer, a hole transport layer, a light emitting layer, an electron transport layer, an electron injection layer and a cathode on a substrate successively, the light emitting layer comprising a lower surface layer close to a side of the hole transport layer, an upper surface layer close to a side of the electron transport layer and an intermediate layer sandwiched between the upper surface layer and the lower surface layer. Forming the light emitting layer may comprise: doping guest emitters in host emitters of the lower surface layer, the upper surface layer and the intermediate layer respectively, and a doping concentration in the lower surface layer is greater than a doping concentration in the intermediate layer, and a doping concentration in the upper surface layer is greater than the doping concentration in the intermediate layer;

Preparation methods for respective layers in the blue organic electroluminescent device and the method for doping guest emitters in the light emitting layer are both known in the prior art, which will not be described in details herein. When the guest emitters are doped in the lower surface layer and the upper surface layer of the light emitting layer, as long as the doping time and the concentration of the guest emitters to be doped are controlled correspondingly, the thickness of the upper surface layer and the lower surface layer doped with guest emitters and the doping concentrations thereof can be controlled.

Figure 3:
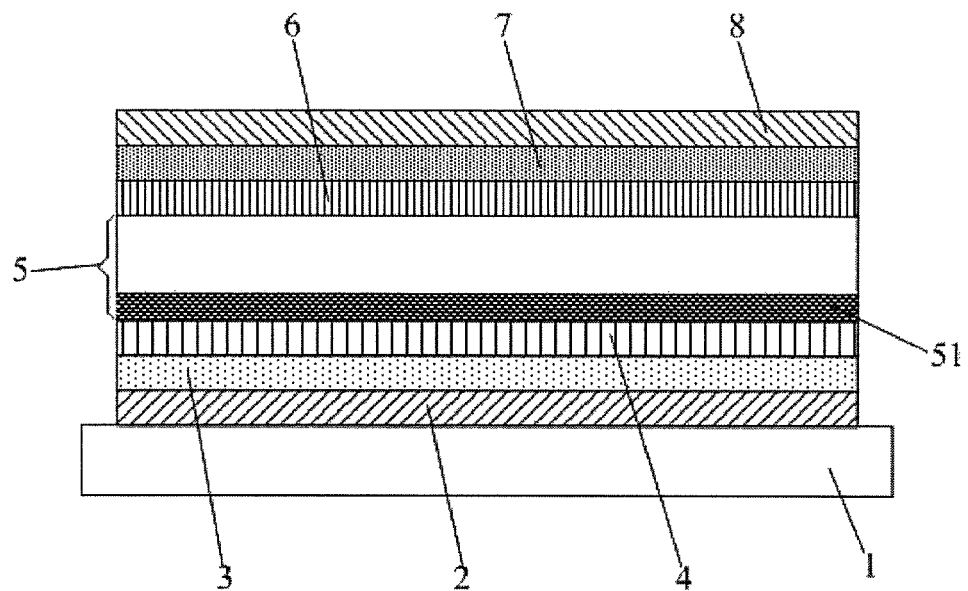
FIG. 3 is a structural sectional view of a blue organic electroluminescent device in another embodiment of the invention.

A further embodiment of the invention provides another blue organic electroluminescent device as shown in FIG. 3, which differs from the aforementioned embodiments. The doping concentration in the lower surface layer 51 is greater than the doping concentration in the intermediate layer, the doping concentration in the upper surface layer is equal to the doping concentration in the intermediate layer. That is, the upper surface layer and the intermediate layer with the same doping concentration can be combined into one layer. The upper surface layer and the intermediate layer with the same doping concentration are neither shown in FIG. 3.

In an embodiment, the doping concentrations in the intermediate layer and the upper surface layer may be both in a range of 4%-8%, the doping concentration in the lower surface layer 51 may be in a range of 20%-50%.

The thickness range of the lower surface layer 51 of the light emitting layer 5 and other structures of the blue organic electroluminescent device in this embodiment may be same as those in aforementioned embodiments, which will not be repeated here. Such a setting can also increase migration rate of the holes in the light emitting layer 5, enhance the injection balance of the electrons and the holes, and reduce the voltage that excites the blue organic electroluminescent device to emit light, thereby reducing the power consumption of the blue organic electroluminescent device; meanwhile, it can also drive the center of the exciton recombination zone to move towards the center of the light emitting layer 5, and reduce existence of interface state between the exciton recombination zone formed by combination of holes and electrons and the hole transport layer 4, thereby reducing occurrence of exciton quenching and increasing efficiency of the blue organic electroluminescent device.

Compared to the embodiment as shown in FIG. 2, the decrease amplitude of the voltage for the blue organic electroluminescent device in this embodiment is apparently reduced, i.e., the decrease amplitude of the power consumption of the blue organic electroluminescent device in this embodiment is apparently smaller than the decrease amplitude of the power consumption of the device in the embodiment as shown in FIG. 2.

Compared to the guest emitter doping concentration of 4%-8%, the blue organic electroluminescent device in this embodiment can reduce the voltage by 10%, and also increases the efficiency of the blue organic electroluminescent device at the same time. However, the increase amplitude of the efficiency of the blue organic electroluminescent device in this embodiment is smaller than the increase amplitude of the efficiency of the device in the embodiment as shown in FIG. 1.

Correspondingly, the preparation method for the blue organic electroluminescent device provided by this embodiment also only needs to control the doping time and the doping concentration to finally enable the concentration of doping guest emitters in the lower surface layer of the light emitting layer close to a side of the hole transport layer to be greater than the doping concentration in the intermediate layer.

The preparation of other structures in the preparation method of the blue organic electroluminescent device in this embodiment can be same as that in the former embodiments, which will not be repeated here.

Figure 4:
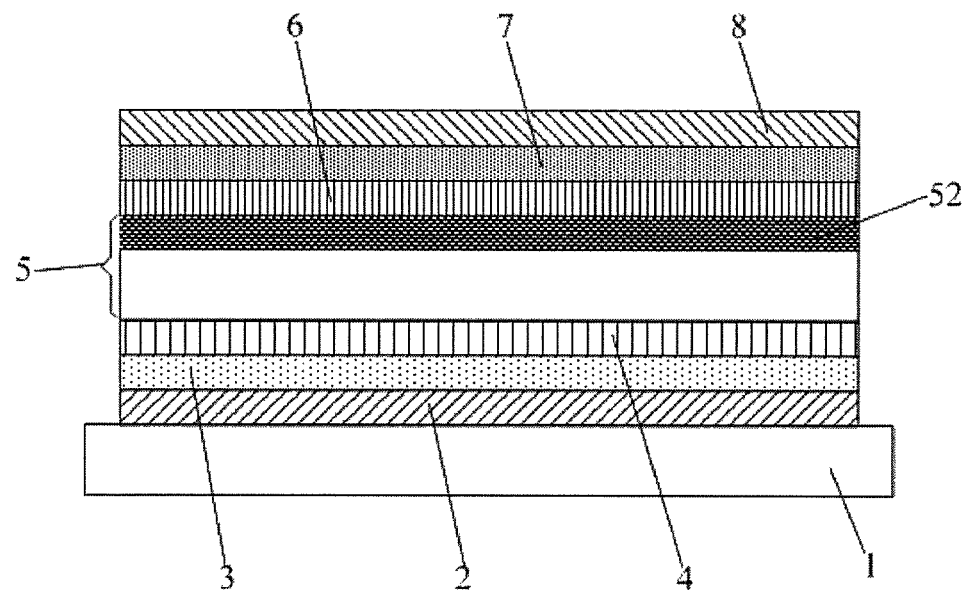
FIG. 4 is a structural sectional view of a blue organic electroluminescent device in yet another embodiment of the invention.

A further embodiment provides a blue organic electroluminescent device as shown in FIG. 4, which differs from the embodiments shown in FIGS. 1 and 2. The doping concentration in the upper surface layer 52 is greater than the doping concentration in the intermediate layer, the doping concentration in the lower surface layer is equal to the doping concentration in the intermediate layer. That is, the lower surface layer and the intermediate layer with the same doping concentration can be combined into one layer. The lower surface layer and the intermediate layer with the same doping concentration are neither shown in FIG. 4.

In some embodiments, the doping concentrations in the intermediate layer and the lower surface layer may be both in a range of 4%-8%, the doping concentration in the upper surface layer may be in a range of 20%-50%.

The thickness range of the upper surface layer 52 of the light emitting layer 5 and other structures of the blue organic electroluminescent device in this embodiment may be same as those in the embodiment shown in FIG. 2, which will not be repeated here. Such a setting can also increase migration rate of the holes in the light emitting layer 5, enhance the injection balance of the electrons and the holes, and reduce the voltage that excites the blue organic electroluminescent device to emit light, thereby reducing the power consumption of the blue organic electroluminescent device; meanwhile, it can also drive the center of the exciton recombination zone to move towards the center of the light emitting layer 5, and reduce existence of interface state between the exciton recombination zone formed by combination of holes and electrons and the hole transport layer 4, thereby reducing occurrence of exciton quenching and increasing efficiency of the blue organic electroluminescent device.

Compared to the embodiment as shown in FIG. 2, the decrease in amplitude of the voltage for the blue organic electroluminescent device in this embodiment is apparently reduced, i.e., the decrease amplitude of the power consumption of the blue organic electroluminescent device in this embodiment is apparently smaller than the decrease amplitude of the power consumption of the device in the embodiment shown in FIG. 2.

Compared to the guest emitter doping concentration of 4%-8%, the blue organic electroluminescent device in this embodiment can reduce the voltage by 5%, and also increases the efficiency of the blue organic electroluminescent device at the same time. However, the increase amplitude of the efficiency of the blue organic electroluminescent device in this embodiment is smaller than the increase amplitude of the efficiency of the device in the embodiment shown in FIG. 2.

Correspondingly, the preparation method for the blue organic electroluminescent device in this embodiment also only needs to control the doping time and the doping concentration to finally enable the concentration of doping guest emitters in the upper surface layer of the light emitting layer close to a side of the hole transport layer to be greater than the doping concentration in the intermediate layer.

The preparation of other structures in the preparation method of the blue organic electroluminescent device in this embodiment may be same as that in the aforementioned embodiments, which will not be repeated here.

For the blue organic electroluminescent devices provided by the above embodiments, by enabling the doping concentration of guest emitters in at least one of the lower surface layer and the upper surface layer to be greater than the doping concentration of guest emitters in the intermediate layer, the voltage that excites the blue organic electroluminescent device to emit light can be reduced greatly, thereby enabling the power consumption of the blue organic electroluminescent device to be reduced greatly; meanwhile, it can also be realized that the exciton recombination zone moves towards the center of the light emitting layer, thereby no interface state exists between the exciton recombination zone formed by combination of holes and electrons and the hole transport layer, so as to reduce occurrence of exciton quenching phenomenon, and increase the efficiency of the blue organic electroluminescent device significantly.

A further embodiment provides a display panel, which may comprise a blue organic electroluminescent device provided by any one of above embodiments.

By using the blue organic electroluminescent device provided by any one of above embodiments, not only the power consumption of the display panel can be reduced, but also the efficiency of the display panel can be increased.

Yet another embodiment of the invention provides a display apparatus, which may comprise a display panel provided by the above embodiment.

By using the display panel provided by the embodiment of the invention, not only the power consumption of the display apparatus can be reduced, but also the efficiency of the display apparatus can be increased.

It can be understood that the above embodiments are only exemplary implementing examples used for explaining the principle of the present invention, however, the present invention is not limited to these. For the ordinary skilled person in the art, in the case of not departing from spirit and essence of the invention, various modifications and improvements can be effected, these modifications and improvements should also be regarded as the protection scopes of the invention.

The invention claimed is:

1. A blue organic electroluminescent device, comprising: a substrate and an anode, a hole injection layer, a hole transport layer, a light emitting layer, an electron transport layer, an electron injection layer and a cathode arranged on the substrate successively, wherein the light emitting layer comprises a lower surface layer close to a side of the hole transport layer, an upper surface layer close to a side of the electron transport layer and an intermediate layer sandwiched between the upper surface layer and the lower surface layer; and host emitters of the lower surface layer, the upper surface layer and the intermediate layer are all doped with guest emitters, wherein a doping concentration in the lower surface layer is greater than a doping concentration in the intermediate layer, and a doping concentration in the upper surface layer is greater than the doping concentration in the intermediate layer;

or wherein the doping concentration in the lower surface layer is greater than the doping concentration in the intermediate layer, and the doping concentration in the upper surface layer is equal to the doping concentration in the intermediate layer;

or wherein the doping concentration in the upper surface layer is greater than the doping concentration in the intermediate layer, and the doping concentration in the lower surface layer is equal to the doping concentration in the intermediate layer.

2. The blue organic electroluminescent device according to claim 1, wherein the doping concentration in the intermediate layer is in a range of 4%-8%, and wherein the doping concentrations in the lower surface layer and the upper surface layer are both in a range of 20%-50%.

3. The blue organic electroluminescent device according to claim 1, wherein the doping concentrations in the intermediate layer and the upper surface layer are both in a range of 4%-8%, and wherein the doping concentration in the lower surface layer is in a range of 20%-50%.

4. The blue organic electroluminescent device according to claim 1, wherein the doping concentrations in the intermediate layer and the lower surface layer are both in a range of 4%-8%, and wherein the doping concentration in the upper surface layer is in a range of 20%-50%.

5. The blue organic electroluminescent device according to claim 1, wherein the thickness of the lower surface layer is in a range of 1-2 nm.

6. The blue organic electroluminescent device according to claim 2, wherein the thickness of the lower surface layer is in a range of 1-2 nm.

7. The blue organic electroluminescent device according to claim 3, wherein the thickness of the lower surface layer is in a range of 1-2 nm.

8. The blue organic electroluminescent device according to claim 4, wherein the thickness of the lower surface layer is in a range of 1-2 nm.

9. The blue organic electroluminescent device according to claim 1, wherein the thickness of the upper surface layer is in a range of 2-3 nm.

10. The blue organic electroluminescent device according to claim 2, wherein the thickness of the upper surface layer is in a range of 2-3 nm.

11. The blue organic electroluminescent device according to claim 3, wherein the thickness of the upper surface layer is in a range of 2-3 nm.

12. The blue organic electroluminescent device according to claim 4, wherein the thickness of the upper surface layer is in a range of 2-3 nm.

13. The blue organic electroluminescent device according to claim 1, wherein the thickness of the intermediate layer is in a range of 20-30 nm.

14. The blue organic electroluminescent device according to claim 2, wherein the thickness of the intermediate layer is in a range of 20-30 nm.

15. The blue organic electroluminescent device according to claim 3, wherein the thickness of the intermediate layer is in a range of 20-30 nm.

16. The blue organic electroluminescent device according to claim 4, wherein the thickness of the intermediate layer is in a range of 20-30 nm.

17. The blue organic electroluminescent device according to claim 1, wherein the host emitter comprises an n-type organic semiconductor material, and the guest emitter comprises a p-type organic semiconductor material.

18. A display panel, comprising a blue organic electroluminescent device according to claim 1.

19. A display apparatus, comprising a display panel according to claim 18.

20. A preparation method for a blue organic electroluminescent device, comprising:

forming an anode, a hole injection layer, a hole transport layer, a light emitting layer, an electron transport layer, an electron injection layer and a cathode on a substrate successively, the light emitting layer comprising a lower surface layer close to a side of the hole transport layer, an upper surface layer close to a side of the electron transport layer and an intermediate layer sandwiched between the upper surface layer and the lower surface layer, wherein forming the light emitting layer comprises:

doping guest emitters in host emitters of the lower surface layer, the upper surface layer and the intermediate layer respectively;

wherein a doping concentration in the lower surface layer is greater than a doping concentration in the intermediate layer, and a doping concentration in the upper surface layer is greater than the doping concentration in the intermediate layer;

or wherein the doping concentration in the lower surface layer is greater than a doping concentration in the intermediate layer, and the doping concentration in the upper surface layer is equal to the doping concentration in the intermediate layer;

or wherein the doping concentration in the upper surface layer is greater than the doping concentration in the intermediate layer, and the doping concentration in the lower surface layer is equal to the doping concentration in the intermediate layer.

\* \* \* \* \*